(12) United States Patent
Lee

(10) Patent No.: US 6,486,008 B1
(45) Date of Patent: Nov. 26, 2002

(54) MANUFACTURING METHOD OF A THIN FILM ON A SUBSTRATE

(75) Inventor: Tien-Hsi Lee, Taipei (TW)

(73) Assignee: John Wolf International, Inc., Taipei ( * ) Notice: Subject to any disclaimer, the term of this patent is extended or adjusted under 35 U.S.C. 154(b) by 37 days.

(21) Appl. No.: 09/630,531

(22) Filed: Aug. 1, 2000

(30) Foreign Application Priority Data

Feb. 25, 2000 (TW) ........................................ 89103407 A

(51) Int. Cl.[7] .......................... H01L 21/00; H01L 21/30
(52) U.S. Cl. ...................... 438/149; 438/459; 438/479; 438/404; 438/53; 438/977
(58) Field of Search ................................. 438/149, 404, 438/50, 455, 459, 478, 479, 480, 977, 460, 53, 407

(56) References Cited

U.S. PATENT DOCUMENTS 5,374,564 A * 12/1994 Bruel ........................... 438/455
6,225,192 B1 * 5/2001 Aspar et al. ................. 438/460

* cited by examiner

Primary Examiner—Matthew Smith
Assistant Examiner—Igwe U. Anya
(74) Attorney, Agent, or Firm—Winston Hsu

(57) ABSTRACT

The invention provides a thin-film transferring method, which can separate a thin film from a supply substrate and transfer it to a demand substrate. The method is practiced first by a process of ion implantation, which implants ions in a supply substrate to form an ion separation layer under implanted surface, and then followed by a wafer-bonding method, which joins the supply substrate with a demand substrate. The resulting bonded structure is to be going through a high-energy ion activation activity, in which the implanted ions incorporate into aerial particles, which fill the cleaves, resulting in a separation film, which is to be transferred to the demand substrate in wafer bonding process. As a part of this invention, the cooling device can remove the heat current produced from the high-energy ion activation, so as to prevent the bonded structure—made from different materials—being damaged by heat due to the different thermal expansion coefficient.

32 Claims, 5 Drawing Sheets

MANUFACTURING METHOD OF A THIN FILM ON A SUBSTRATE

BACKGROUND OF THE INVENTION

1. Field of the Invention

The present invention provides a thin semiconductor film transferring method; more particularly, it is a layer transferring method for transferring a thin film onto a dissimilar material, a thin film of the same area as the wafer, of a sub-micron thickness, and of the thickness and flatness at the VLSI standard, and with low defect in the film density.

2. Description of the Prior Art

The wafer bonding technology demonstrates to join two silicon wafers by bonding the silicon atoms on the surfaces of the wafers without glue was publicized by J. B. Lasky at the IEDM meeting held by IEEE in 1985. The said technology can join two single crystal wafers of very different lattice parameters immaculately without any glue, and the resulting bonding strength of the bonding interface can be as strong as the substrate. For this reason, the technology satisfies the strict standards for the uncontaminated bonding interface for modem electric materials and opto-electronics materials. Because of the advantages described above, the wafer bonding technology has drawn much attention after its disclosure.

Later W. Maszara utilizing the principle of elastic mechanics introduced the insertion method to measure the bonding strength in 1988. Insertion method was a simple and quick method to check the bonding qualities of two bonded wafers.

Maszara also used a heavy doping P$^+$ type silicon layer as an etch-stop layer to fabricate submicron thickness silicon on insulator such as silicon dioxide to form the silicon on insulator (SOI) structure material. That extended the applicable field of the wafer bonding technology to advanced electric materials, opto-electronics materials, and microelectro-mechanical systems (MEMS). However, the wafer bonding technology still has some disadvantages, such as the existence of the etch-stop layer on the surface of the wafer after etching and the uniformity of etching on different sites of the etch-stop layer caused the problem related to the total thickness variation (TTV). In addition, the process requires too much time-not only many supply substrates are wasted, and some environmental pollution problems may occur due to the discarded fluid. At that time, the Separation by Implantation Oxygen (SIMOX) method was also energetically developed in making SOI material. Because the thin film formed by SIMOX method has a perfect uniform thickness, wafer bonding technology may lost its leadership in the field of SOI wafer production if its TTV value can not be improved.

Until the end of 1994, M. Bruel announced the success of the development of a new thin film transfer technology so called Smart-Cut process. With the approach of the Smart-Cut process, the thickness of SOI material can be made as well as with the SIMOX method. According to the claims of U.S. Pat. No. 5,374,564, an implantation process is performed first to implant high dosage of hydrogen ions or gas ions from VIII group into a supply substrate, and the supply substrate is bonded onto a demand substrate. A thermal treating process is then performed to gather these gaseous ions in the implantation layer, and causes the formation of micro-bubbles. The temperature is continually increased to increase the pressure of bubbles formed by incorporating micro-bubbles so as to separate the implanted thin film from the supply substrate and transfer onto the demand substrate, and the thin film on the demand substrate is formed. Because of the advantages of the Smart-Cut process, such as uniform thickness of thin film, less defects in density, no wasted materials, the unharmful released hydrogen, and that the supply substrates can be reused, the thin film transferring technology has been developed quickly with the wafer bonding method.

But the Smart-Cut process has some disadvantages, such as the thermal stresses generated from thermal treating process or the low manufacturing efficiency due to the time to reach sufficient strong bonding strength at lower temperature prior to layer splitting. The thermal treatment of the Smart-Cut process is performed by a heat source to activate the implanted hydrogen ions to be gathered to form bubbles, so that the ion separation layer is separated due to the expansion of the bubbles, and then the thin film transferring is achieved. When the thermal treatment is performed, the heat is first transmitted to the surface of the bonded substrates to rise the temperature of the surfaces, and then the heat is transmitted to the inner of the substrate due to the temperature difference between the surface and inner of wafer. That results in the following five disadvantages:

1. According to the low temperature bonding technology, the initial bonded wafer pairs need a long annealing time to enhance the bonding strength. That is, before the bonding strength is strong enough to gather bubbles to form a force to separate the wafers, the temperature must be controlled lower than 450° C. which is the temperature that the hydrogen ions cause distinct bubbles. Because the initial bonded wafer pairs must be controlled lower than 450° C. to perform an annealing process, the annealing time is too long, and the throughput is decreased.
2. The substrates must be heated a whole to make the uniform rising of the temperature of the substrates. And in order to achieve the expected result, the heating temperature in the prior art is about greater than 500° C. However, when the substrates are dissimilar materials, a large thermal stresses will occur to destroy the bonding structure due to the different thermal expansion coefficients of dissimilar materials, furthermore, cracks may occur in the bonding structure before layer transferring to destroy the bonded materials.
3. The instant heat amount is transmitted unequally, so the instant temperature of each point within the substrates is unequal. That results in the timing and the position of thin film separation varies, and inner stresses cause granulation of the transferring interface, even more, cause many interstices.
4. The thermal efficiency of the annealing process which transfers thermal energy into kinetic energy is quite low, much energy of the heat source is wasted, so the manufacturing cost is increased due to the maintain in high temperature.
5. For some materials, such as $Al_2O$ or $LaAlO_3$, the Smart-Cut process is not able to form enough micro-bubbles to separate the thin films.

The present invention directly excites the implanted ions or molecular ions by the high frequency alternating electric or electromagnetic field to increase the collision frequency. Thus, the micro-bubbles generate and expand quickly so as to transfer the thin film from the supply substrate to the demand substrate. It has been proved that the present invention can reduce the cost, increases the throughput, and improves the quality of products.

SUMMARY OF THE INVENTION

It is an object of the present invention to a thin film transferring method for a thin film on a substrate in a similar or heterogeneous material structure, having a transferring area equal to the size of the wafer, having a thickness of sub-micron degree, having a total thickness of VLSI degree, and with low defect density.

In the preferred embodiment of the present invention, an ion implantation process is performed to implant ions or molecular ions into the supply substrate and to form an ion separation layer in the supply substrate. A wafer bonding process is then performed to bond a demand substrate onto the supply substrate to form a bonded structure. Then the bonded structure is placed into a high frequency alternating electric field, or a high frequency alternating electromagnetic field to perform an ions activation process. Using microwaves, radio frequency, or inductive coupled field which increase the kinetic energy of the implanted ions, molecular ions, or reactants produced by reactions between the ions and the substrate in the bonded structure the thin film transferring from the surface along the ion implanted plane of the supply substrate to the surface of the demand substrate.

For layer transfer of dielectric loss supply substrate, the present invention performs with phase-in ion implantation. The present invention first implants the ions at high temperature to form crystal fissures, and then implants ions at lower temperature into the crystal fissures to prevent the loss of diffusion of the implanted ions, and the dosage of ions is enough to form micro-bubbles to form a separation layer. Next, perform ion activation by high frequency alternating electric or electromagnetic field to form inductive energy to increase the kinetic energy of these implanted ions to gather in gas molecules to form cracks, and separation of thin film is finished. By this way, the total dosage of implanted ions can be decreased, the cost is retrenched, and the density of the defect of the thin film is improved.

Besides, the present invention is further applied in a thin film cutting process. First, perform an ion implantation to form one or more ion separation layer within the thin film. Then, perform an irradiation of the high frequency alternating electric or electromagnetic on the thin film to gather the implanted ions in gas molecules, and a separation layer is formed to separate the thin film. The thin film cutting is finished.

DETAILED DESCRIPTION FOR THE PREFERRED EMBODIMENT

Refer to FIG. 1 to FIG. 5, FIG. 1 to FIG. 5 are schematic diagrams of the process of the layer transferring method according to the present invention. The present provides a method of separating a thin film 12 from a supply substrate 10, and transferring to a demand substrate 14. The thin film can be Si, Ge, SiGe, group II–VI compound, or group III–V compound.

Figure 1:
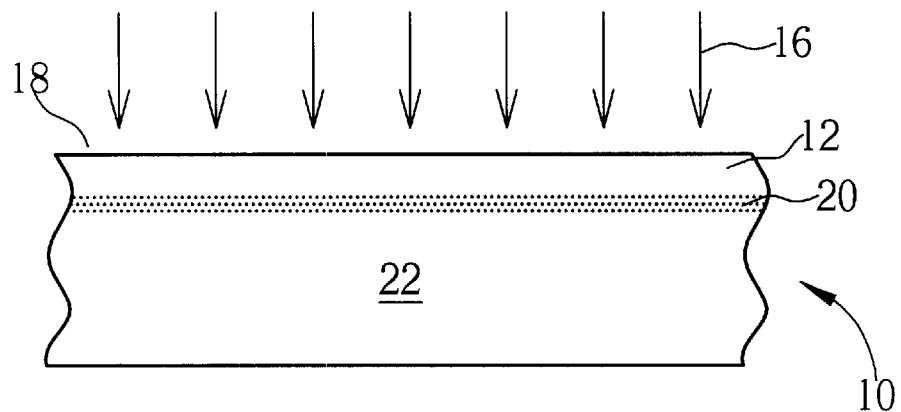
FIG. 1 to FIG. 5 are schematic diagrams of the process of the layer transferring method according to the present invention.

As shown in FIG. 1, an ion implantation is performed to implant ions or molecular ions 16 perpendicularly into the surface 18 of the supply substrate to form an ion separation layer 20. The ion separation layer 20 forms two areas of the supply substrate 10: one is a thin film 12 that is defined by implanted ions or molecular ions 16 within the supply substrate 10, and the other is the area that is the remaining portion of the supply substrate 10 without the thin film, defined as remnant substrate 22. Because the depth of the thin film 12 is decided by amount of the ion implantation energy, the thickness of the thin film 12 used to transfer could be defined exactly. The ion implantation process can be performed by a standard ion implantation process by ion implanter, or a plasma ion implantation immersion process, or a phase-in ion implantation process that is performed at different temperatures for each process phase, and the ions used in the ion implantation process comprise hydrogen ions, oxygen ions, nitrogen ions, fluorine ions, chlorine ions, helium ions, or neon ions, or the ions are used in the ion implantation process are molecular ions.

The purpose for performing the ion implantation is to implant amounts of ions or molecular ions 16 into the surface of supply substrate 10, the implanted ions or molecular 16 ions then collide the atoms in the supply substrate 10 so as to break the bonding between the atoms and the nearby atoms, even to form a new weak bonding between the atoms and the nearby atoms replacing the old bonding, so that the original lattice structure within the layer may be destroyed. And the implanted ions and molecular ions 16 may react with the atoms in the ion separation layer 20 within the supply substrate 10 and results in corrosion to speed the destruction of the lattice structure in the ion separation layer 20. Besides, the implanted ions or molecular ions 16 of the ion separation layer 20 within the supply substrate 10 are in a excited state as active seeds, and the ions with residual dosage or the molecular ions 16 which not collide to become into single atoms will be embedded into the lattice gap, and volume strain stresses may occur to make the ion separation layer 20 a stress concentration area. The bonding force of the lattice with the implanted ions in it is lower, and the mechanical property of the portion near the ion separation layer 20 of the supply substrate 10 is weak, such as hydrogen embitterment effect.

Figure 2:
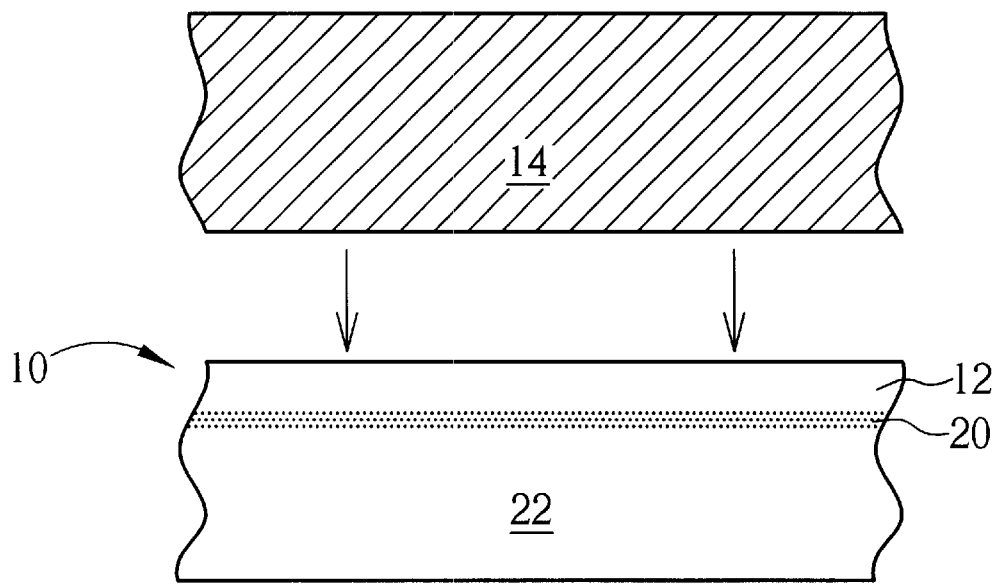

As shown in FIG. 2, a wafer bonding technology is performed with a plasma treatment to provide sufficient bonding strength for the supply substrate 10 and demand substrate 14 so as to bond the two substrates 10, 14 into a bonded structure. The wafer bonding technology can be a direct bonding process, an anodic bonding process, a low temperature bonding process, a vacuum bonding process, or a plasma enhanced bonding process.

Figure 3:
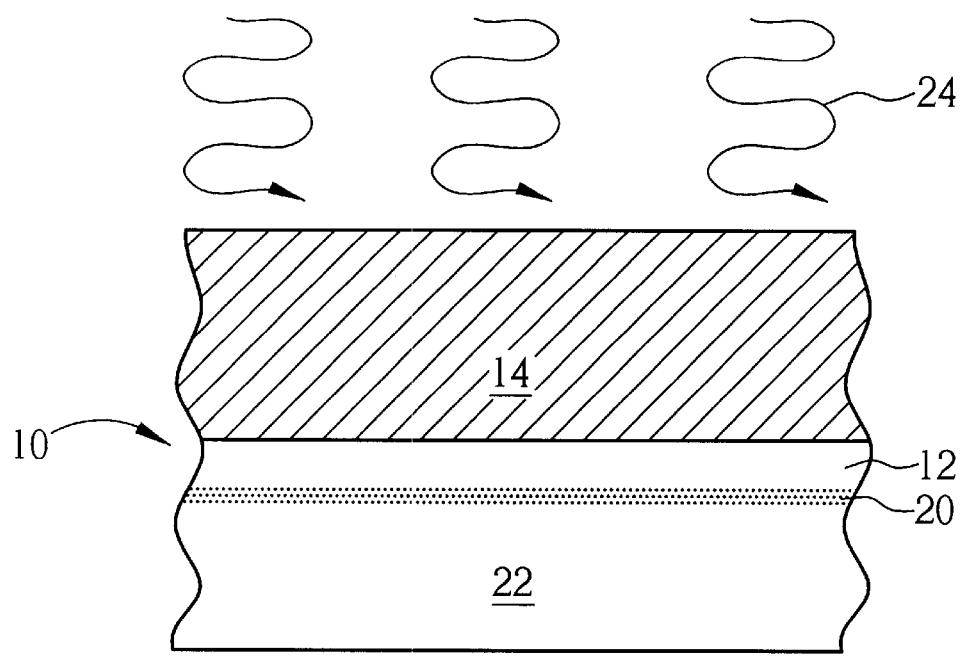

As shown in FIG. 3, the bonded structure is irradiated by a high frequency alternating electric field or a high frequency alternating electromagnetic field 24. The implanted ion or the molecular ion 16 or the ion produced by collision will pair with the atoms of the supply substrate 10 with a weak bond. The atomic bonding pair would, negatively polarized, be induced by the high frequency alternating electric or electromagnetic field to greatly increase vibration of the atoms nearby the ion separation layer 20 so as to break the bonding between the atoms. Then these atoms would bind with each other to form gas molecules again, resulting in some crystal fissures filled with the gas molecules.

Figure 4:
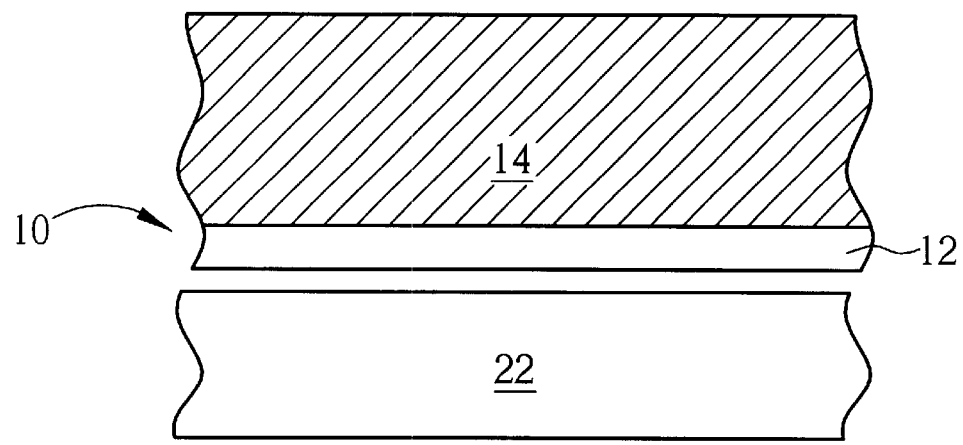

Besides, the carriers (electrons or holes) resulted from doping atoms on the supply substrate 10 form an inductive current in the high frequency alternating electric or electromagnetic field. Because of the high resistance of the supply substrate, the heat energy in great profusion is formed by high inductive current density and passed by the carriers into the crystal fissures, and is directly transferred to the nearby gas molecules through inelastic collision, raising the kinetic energy of the gas molecules and increasing the collision frequency; as a result, the gas volume expands quickly. As shown in FIG. 4, the result makes the fissures within the ion separation layer 20,under the stresses caused by the volume expansion, expand along the tips in a very short interval. In this process, the thin film 12 is separated from the remnant substrate 22 of the supply substrate and is transferred to the demand substrate 14.

Figure 5:
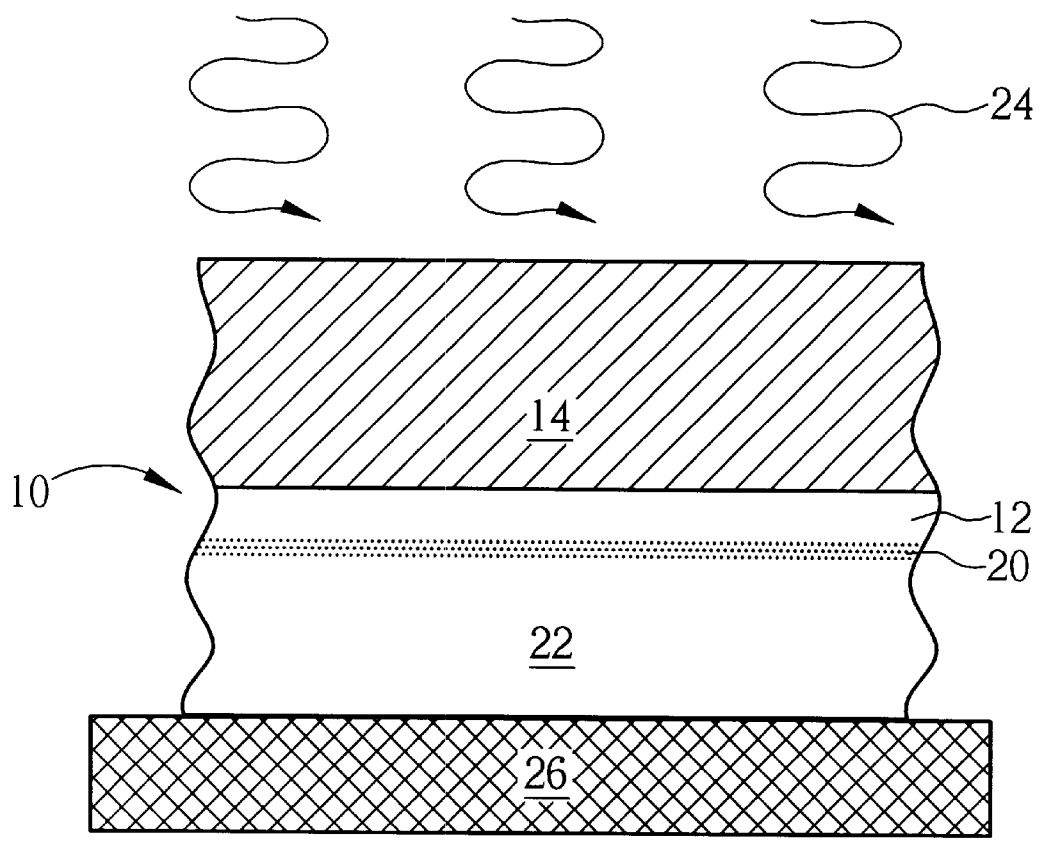

As shown in FIG. 5, because the excess heat energy produced in the remnant substrate 22 or in the demand substrate 14 is not preferred, the present invention further provides a cooler 26 to absorb the excess heat generated through the high frequency alternating electric or electromagnetic field 24 so as to keep the temperature of the bonded structure under 400° C. (depending on the kinds of the materials of the supply substrate 10 and the demand substrate 14). Since the cooler can absorb a great amount of heat, and it broadens the application area of the present invention.

The high-energy ions activation effect caused by the high frequency alternating electric or electromagnetic field incurs an electric couple effect to weaken the bonds between the implanted ions and the atoms of the supply substrate, resulting in the fast formation of fissure in crystal to lead these implanted ions to be driven into the fissure and be condensed into gas molecules. The high-energy ions-activation effect also induces a strong inductive current among the carriers which—such as electrons or holes—in the semiconductor material, resulting in the formation of a great amount of energy in a short time. Besides, in the ion separation layer and in the resulting crystal fissure, the implanted ions or the molecular ions, as activated species, attracts these fast-moving carriers, causing Skin Effect. Under Skin Effect, the attracted carriers move within the ion separation layer and then transfer the energy absorbed from high frequency alternation electric or electromagnetic field, through the inelastic collision between the carriers and the molecules in the ion separation layer, to these molecules.

With the method of exciting the kinetic energy of molecules by the high frequency alternating electric or electromagnetic field, the energy is produced in the carriers of the substrate itself due to electric induction, without relying on the heat energy transmitted from outside into the substrate. Because of the even distribution of the carriers in the substrate and because of the light speed at which the electric wave is transmitted, the energy is transmitted directly and fast; these features render this thin-film separation method many merits: fast and even heating, high heat efficiency, and fast response. So the present invention rectifies the weaknesses of the conventional thermal process: uneven heating, waste of time and energy.

The present invention utilizes the high-frequency alternating electric or electromagnetic field to excite molecular energy to perfectly cut from a semiconductor substrate a thin film of large size and uniform thickness with low defect density, and to transfer it to another substrate to make a body of a new material, or to apply to the production of silicon on insulator (SOI) of a submicro-thickness.

Figure 6:
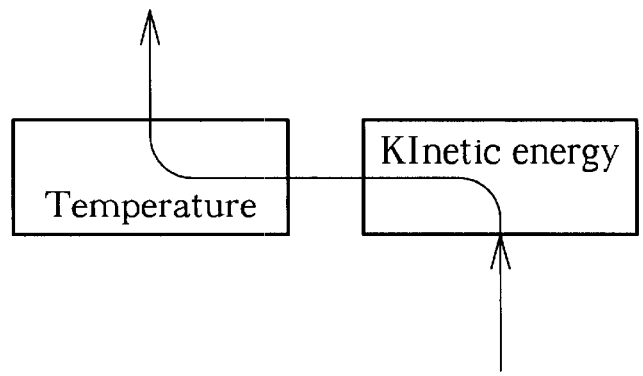
FIG. 6 and FIG. 7 are schematic diagrams of energy supplied in the present invention and that in the prior art, respectively.
Figure 7:
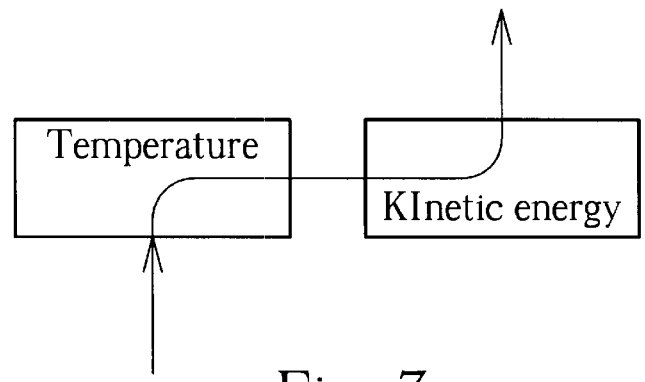

Please refer to FIG. 6 and FIG. 7. FIG. 6 and FIG. 7 are the illumination diagrams of energy supply in the present invention and the prior art respectively. As shown in FIG. 6, the kinetic energy of the implanted ions or molecule ions are excited to separate the ion implanted layer in the high frequency alternating electric or electromagnetic field in the thin film separation process. Since the increase of kinetic results in the rise of temperature, with the increase of the kinetic energy of molecules or atoms the temperature of substrate rises. However, the rise of temperature is merely a by-product of the excitation of kinetic energy through the high frequency alternating electric or electromagnetic field; it is not the major purpose of the present invention. As shown in FIG. 7, the main method of the prior art to separate the thin film is to apply heat to raise the temperature of the bonding structure. Apparently, the difference between the two methods lies in their ways to excite the kinetic energy: whereas the heating method is used in the prior art, the high frequency alternating electric or electromagnetic field is used in the present method; and the kinetic energy is raised from outside heat energy in the prior art, while in the present invention it is raised from within.

Besides, for transferring the thin film from low dielectric loss supply substrate, such as the substrate of $SrTiO_3$, $Al_2O_3$, and $SiO_2$, if the ions of hydrogen are implanted at low temperature, they would not combine to form micro-bubbles, which is necessary in the thin-film separation, not even when high temperature treatment is applied in the process. However, some current papers report that by implanting ions in a high-temperature environment, which is annealed after, micro-bubbles can be formed. But the efficiency of this method in combining ions is not satisfactory, because ions are lost through diffusion at high temperature. In order to make up for the loss, a higher dosage of ions must be implanted. The present invention solves this problem with a phase-in ion implantation method, in which the ions are implanted at high temperature to form crystal fissures, and then at low temperature, more ions are implanted into the fissures to prevent them from escaping through diffusion. By this method, micro-bubbles are formed to engender a separation layer of enough ion concentration, and the amount of ions needed in this invention is less than in the prior art. Consequently, the thin-film separation can be accomplished with lower cost, and lower density of the defect in the thin film.

In short, the present invention includes three different operating methods:

Implant ions into the supply substrate 10 at high temperature to create the crystal fissures but not form blister(s) on the surface of supply substrate 10. Then add more ions at lower temperature to be sufficient high for micro-bubbles generation in following annealing process, and bond the supply substrate 10 and the demand substrate 14 together. According to the principles of fracture mechanics, the magnitude of force needed to tear the ion separation layer 20 from the supply substrate 10 will decrease if the crack expands along the tips of fissures; therefore, when the high frequency alternating electric or electromagnetic field irradiates the bonded structure, the implanted ions or molecular ions 16 within the supply substrate 10 cause enough high stresses due to gas expansion to separate the thin film 12 before the inductive heat breaks the bonding structure during the heating process.

After the formation of the ion separation layer 20 from the ion implantation, the supply substrate 10 is preheated to create crystal fissures. As the ion separation layer 20 in the supply substrate 10 is in a high-stressed critical state ready for separation, the supply substrate 10 is bonded to the demand substrate 14, and the bonded structure is put in the high frequency alternating electric or electromagnetic field 24, in which the bonded structure absorbs energy and thus implanted ions possesses an expansion force. As the expansion force exceeds its malleability critical value, it tears the ion separation layer 20 away and the thin film 12 is separated.

In the third method, a layer with heavily doping atoms is made in order to obtain a high concentration of local carriers for energy transmission. Because the carriers absorb energy under the irradiation of microwave, and the concentration of carriers decides the amount of energy to be absorbed and transmitted, the implanted ions or molecular ions 16, in this case, benefited from the high concentration of the carriers, absorb a great amount of energy in a very short time interval and create crystal fissures for layer transfer prior to the great thermal stresses generation as the temperature rises.

In the first method, ions are implanted into a supply substrate at high temperature to create crystal fissures, and then more ions are implanted into the fissures. The implanted ions or molecular ions absorb the energy of the high frequency electric or electromagnetic field and, upon expansion, separate the thin film. The method is also efficient in transferring the thin film from an instruction substrate. But the carriers, which can incur the energy of the high frequency electric or electromagnetic field, are not produced in an instruction substrate, instead, the gas molecular ions are to fulfill this mission of the carriers. In the third method, the heavily doping layer is created through ion implantation, molecular beam epitaxial growth, and liquid phase epitaxial growth or vapor phase epitaxial growth. And the concentration of the doped atoms are monitored in order to achieve selective energy absorption and transmission so as to avoid the problem of the bonded dissimilar material structure being destroyed due to the rise of temperature.

In the present invention, rise of temperature is the by-product in the process of thin-film separation, not the core technique of the invention, as in the prior art in which heating is its main strategy. Furthermore, the rise of temperature is not good in transferring the thin-film made from the substrates of different materials. The present invention provides a cooler to remove the extra heat, without affecting the thin-film transfer in the ion separation layer, reducing the heat stress of the bonded structure.

The present invention forms the needed energy by availing of the high frequency alternate electric or electromagnetic field, such as microwave, radio frequency, or inductive coupled field, to excite the kinetic energy of the implanted ions or molecular ions; whereas in the prior art, the energy needed in exciting the implanted ions is obtained indirectly through heating. The present invention can transmit the energy efficiently so as to avoid the consumption of energy in increasing temperature. And by exciting each layer uniformly and simultaneously, the excited energy is distributed uniformly over the layer, improving the quality of the product. Besides, the method of exciting energy by the high frequency alternating or electromagnetic field shortens the production time, makes production process in a cleaner stages, and makes more convenient the operation comparing to the conventional method.

Furthermore, the present invention also can be applied to the thin film cutting process, in which one or more ion separation layers are formed with the ion implantation process. And then through the irradiation of high frequency alternating electric or electromagnetic field, the implanted ions condenser into gas molecules, resulting in a separation film, which is to be removed to finish the thin-film cutting process.

Figure 8:
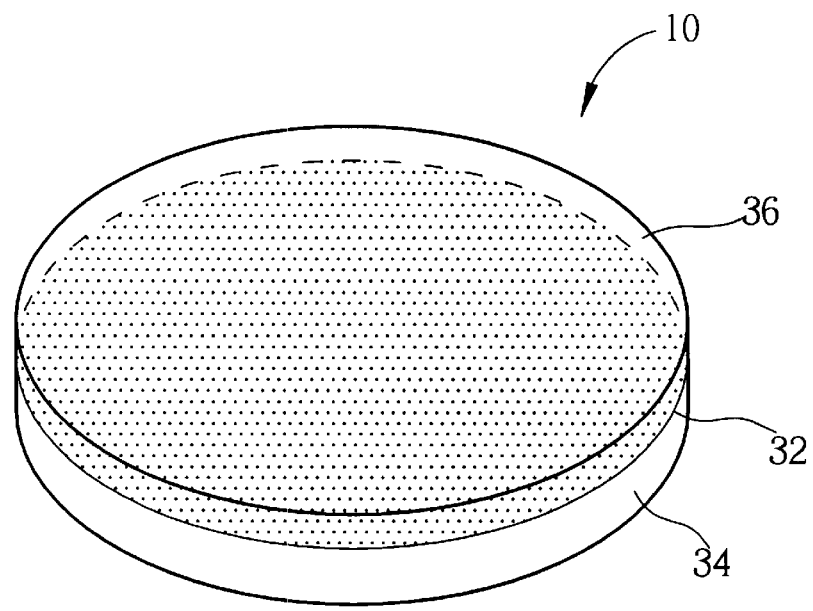
FIG. 8 to FIG. 10 are schematic diagrams of the process of the thin film cutting method according to the present invention.
Figure 9:
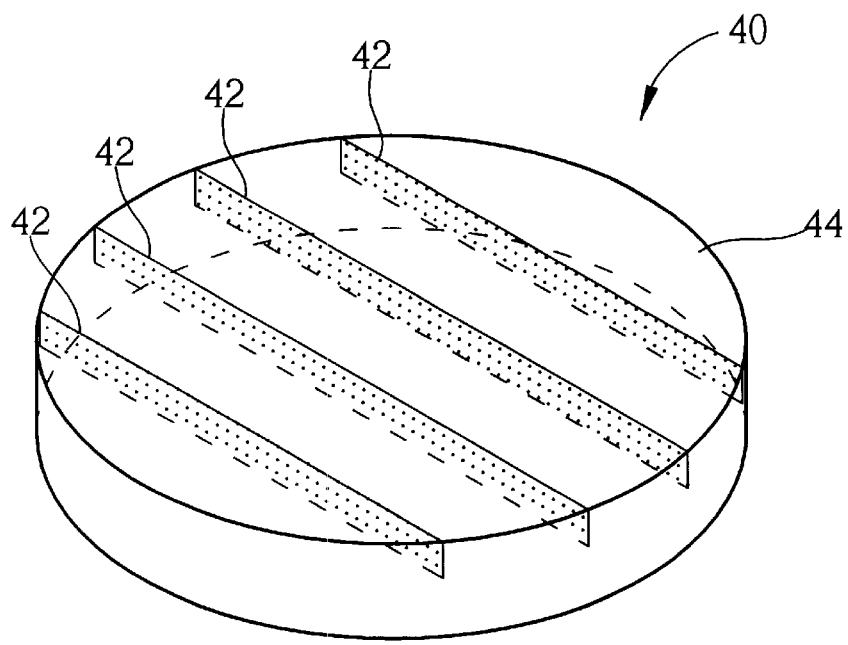
Figure 10:
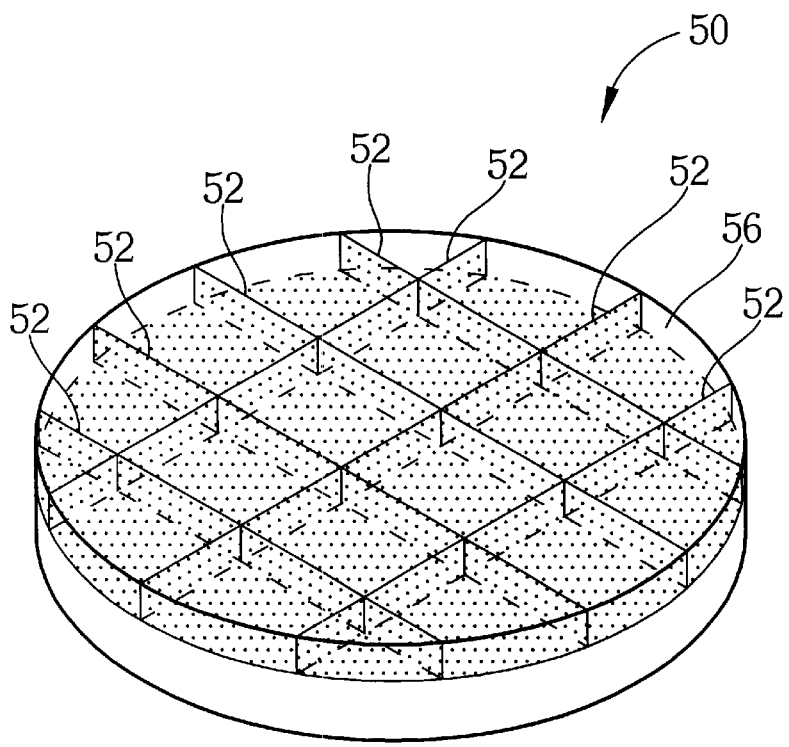

Refer to FIG. 8 to FIG. 10. FIG. 8 to FIG. 10 are the explanation diagrams of thin film cutting with the method provided in the present invention. As shown in FIG. 8, the present invention performs an ion implantation to form an ion separation layer 32 parallel to the surface of the thin film 30 in the thin film 30. Then a high frequency alternating electric or electromagnetic field irradiates the thin film 30 to condense the implanted ions into gas molecules to fill the fissure created by the gas molecules, resulting in a separation layer. The separation layer separate the separation film 30 into the two thin films 34 and 36, which have the same cutting surface area as the thin film 30.

As shown in FIG. 9, the thin film 40 is cut vertically first by implanting a plurality of ions of various energy into the thin film 40 form a plurality of the ion separation layer 42 perpendicular to the thing film 40. In other words, each ion separation layer 42 is a vertical layer formed in a predetermined area in the thin film 42 by a plurality of ion implantation lines at different depths. And then, under the irradiation of the high frequency alternating electric or electromagnetic field, the implanted ions in the ion separation layers condense into gas molecules, cutting the thin film 40 into a plurality of thin film layers 44. In FIG. 10, the ion separation layers 52 also can be formed crisscross within the thin film 50 to cut the thin film 50 into a plurality of smaller thin films 56.

Hereinafter, a few desirable sample operations for the present invention are provided here to further explain the fabrication method and the characteristics of the present invention.

The first embodiment shows that the kinetic energy of the implanted ions or ionic molecules in the ion separation layer is excited with electromagnetic irradiation, in this case microwave irradiation, in achieving layer transfer.

In the first embodiment, the supply substrate is a p-type, one side polishing, (100), and 15–25 ohm-cm silicon wafer. The surface of the supply substrate is covered with silicon nitride ($Si_3N_4$) of 1500 Å thick and silicon dioxide of 500 Å thick under the silicon nitride layer. $3.5 \times 10^{16}$ atoms/cm$^2$ of hydrogen ions with energy 200 KeV is implanted into the substrate. The demanded substrate is a p-type, one side polishing, (100), and 15–25 ohm-cm silicon wafer. The two wafers are bonded by low temperature wafer bonding method first and the bonded pair is placed in a microwave setup and irradiated at 2.45 GMz for five minutes. Then a silicon thin film of about 0.75 µm thick is separated from the supply substrate and transferred onto the demanded substrate, resulting in a SOI wafer with an insulation layer of silicon nitride.

In the second embodiment, the supply substrate is a p-type, one side polishing, (100), and 15–25 ohm-cm silicon wafer. The surface of the supply substrate is covered with silicon nitride ($Si_3N_4$) of 1500 Å thick and silicon dioxide of 500 Å thick under the silicon nitride layer. $3.5 \times 10^{16}$ atoms/cm$^2$ of hydrogen ions with energy 200 KeV is implanted into the supply substrate. The demanded substrate is a p-type, one side polishing, (100), and 15–25 ohm-cm silicon wafer. The two wafers are bonded by low temperature wafer bonding method first and the bonded pair is placed in a microwave setup with a cooler to keep the irradiating temperature no greater than 400° C., and is irradiated at 2.45 GMz for five minutes. Then a silicon thin film of 0.75 µm thick is separated from the supply substrate and transferred to the demanded substrate, resulting in a SOI wafer with an insulation layer of silicon nitride.

In the third embodiment, the supply substrate is a p-type, one side polishing, (100), and 15–25 ohm-cm silicon wafer. Hydrogen molecular ions are implanted twice. On the first implantation, $1.5 \times 10^{16}$ atoms/cm$^2$ of hydrogen molecular ion with energy 200 KeV is implanted into the substrate at 550° C. On the second implantation, $4 \times 10^{16}$ atoms/cm$^2$ of hydrogen molecular ion with energy 200 KeV is implanted into the substrate at room temperature. The demanded substrate is a glass wafer with one polished side. The two wafers are bonded with low temperature wafer bonding method into a bonded structure and then the bonded structure is placed in a microwave oven and irradiated at 2.45 GMz for five minutes. Then a silicon thin film of 0.75 μm thick is separated from the supply substrate and transferred to the demanded substrate, resulting in a SOI wafer with a main body of glass substrate.

In the forth embodiment, the supply substrate is a p-type, one side polishing, (100), and 15–25 ohm-cm silicon wafer. $3.5\times10^{16}$ atoms/cm$^2$ of hydrogen ion with energy 200 KeV is implanted into the substrate. The demanded substrate is a glass wafer with one polished side. The supply substrate is placed in a high temperature furnace, and is heated at 550° C. for 15 minutes, so as to apply inter pressure generated by implanted ions to the ion separation layer until a critical state to create blisters is reached. Then the two wafers are bonded with low temperature wafer bonding method into a bonded structure and then the bonded structure is place in a microwave oven and irradiated at 2.45 GMz for five minutes. Then a silicon thin film of 0.75 μm thick is separated from the supply substrate and transferred to the demanded substrate, resulting in a SOI wafer with a glass substrate as its main body.

In the fifth embodiment, the supply substrate is a p-type, one side polishing, (100), and 0.10–0.25 ohm-cm silicon wafer. $3.5\times10^{16}$ atoms/cm$^2$ of hydrogen ion with energy 200 KeV is implanted into the substrate. The demanded substrate is a glass wafer with one polished side. The two wafers are bonded with low temperature wafer bonding method into a bonded structure and then the bonded structure is place in a microwave oven and irradiated at 2.45 GMz for five minutes. Then a silicon thin film of 0.75 μm thick is separated from the supply substrate and transferred to the demanded substrate, resulting in a SOI wafer with a glass substrate as its main body.

In the sixth embodiment, the supply substrate is a p-type, one side polishing, (100), and 15–25 ohm-cm silicon wafer. Ion implantation is performed twice. On the first implantation, $1\times10^{16}$ atoms/cm$^2$ of B$^+$ with energy 180 KeV is implanted into the substrate. And on the second implantation, $5\times10^{16}$ atoms/cm$^2$ of hydrogen molecular ions is implanted. The demanded substrate is a glass wafer with one polished side. The two wafers are bonded with low temperature wafer bonding method at room temperature into a bonded structure and then the bonded structure is placed in a microwave oven and irradiated at 2.45 GMz for five minutes. Then a silicon thin film of 0.35 μm thick is separated from the supply substrate and transferred to the demanded substrate, resulting in a SOI wafer with a glass substrate as its main body.

In the seventh embodiment, the supply substrate is a (100), p-type, 15–25 ohm-cm silicon wafer with a epitaxial layer doped B and Ge atoms of 1.5 um thick (B/Ge: $2.0\times10^{20}/2.0\times10^{21}$/cm$^3$) and a 0.35 um thick silicon epitaxial layer capping on the top. $5\times10^{16}$ atoms/cm$^2$ of hydrogen ion with energy 120 KeV is implanted into the substrate. The demanded substrate is a glass wafer with one polished side. The two wafers are bonded with low temperature wafer bonding method at room temperature into a bonded structure and then the bonded structure is place in a microwave setup and irradiated at 2.45 GMz for five minutes. Then a silicon thin film of 0.3 μm thick is separated from the supply substrate and transferred to the demanded substrate, resulting in a SOI wafer whose main body is a glass substrate.

In the eighth embodiment, the supply substrate is a (0001) sapphire (Al$_2$O$_3$) wafer with both sides polished. Hydrogen molecular ions are implanted in two stages. On the first implantation, $3\times10^{16}$ atoms/cm$^2$ of hydrogen ion with energy 200 KeV is implanted into the substrate at 650° C., and followed by a second implantation at room temperature with $3\times10^{16}$/cm$^2$ of hydrogen molecular ions with 200 KeV of energy. The demanded substrate is a (100), p-type silicon wafer with one side polished. The two wafers are bonded with low temperature wafer bonding method into a bonded structure and then the bonded structure is place in a microwave oven and irradiated at 2.45 GMz for five minutes. Then a thin film of 0.6 μm thick is separated from the supply substrate and transferred to the demanded substrate, resulting in a silicon substrate covered with an Al$_2$O$_3$ thin film.

Microwave is a kind of electromagnetic wave generator with its wavelength in the range of 1 cm~1 m, between the wavelengths of infrared ray and of radio wave, and radar transmission occurs in the range of 1 cm–25 cm, and the telecommunication occurs outside of this range. In order to avoid interfering with these telecommunication waves, the wavelength of microwave is set between 12.2 cm (2.45 GMz) and 33.3 cm (900 MHz). Microwave causes the variation of the electric or electromagnetic field and so passes through its subject evenly. The positive pole in the high frequency alternating electromagnetic field formed by microwave magnetizes the negative pole of the polar molecules within the subject and, on the variance of high frequency alternating electromagnetic field, transforms to a negative pole, which magnetizes the positive pole of the polar molecules, resulting in the polar molecule's alternating direction, vibrating and spinning around an axis. The polarization of the polar molecules caused by microwave makes the polar molecules oscillate at high frequency (2.45 GHz), and increases its kinetic energy; the nearby molecules oscillate along and, by rubbing with each other, produce frictional heat, increasing the temperature. Although the penetrability of microwave is only 2.5 cm~3.5 cm, it is good enough to the thickness of the semiconductor wafer for today's market Accordingly, the implanted ions or molecular ions bind with the atoms of the substrate in the ion separation layer, and the resulting dipole reacts to the variance of the high frequency alternating electromagnetic field direction, converting the energy of microwave into kinetic energy. But beside this method, there is another method, in which the atoms are doped in a supply substrate to form N-type or P-type carriers to produce material with a certain resistance. By irradiating the supply substrate with a microwave, which, with its alternative electric or electromagnetic field direction, causes electromagnetic induction, the carriers within the supply substrate therefore begets a strong inductive current. Because the supply substrate is made of semiconductor material, it has high resistance and so, through resistive heating, produces energy with its accompanying inductive current. The energy is transmitted and, through inelastic collision, to the molecules formed by implanted ions or molecule ions, raising the kinetic energy of the molecules. In this way, a conventional thermal treatment is not needed to heat the bonded structure in indirectly exciting the kinetic energy of the implanted ions or molecule ions.

With this method, the surface polar molecular clusters—such as water molecular compound obtained with surface cleaning treatment such as RCA cleaning method, or oxygen ion clusters obtained with an oxygen plasma process—activate the surface atoms of the two substrate so as to increase the reactivity of the atoms in the bonding interface of the bonded structure, and they react with each other to form chemical bonds so as to increase the bonding energy the of bonded structure to achieve a sufficient high bonding strength. The increase of the bonding energy prevents the supply substrate from falling due to the formation of bubbles during the irradiation process before the thin film is separated from the supply substrate.

Moreover, in this invention, the kinetic energy of the implanted ions or molecular ions is increased to break the bonds with the atoms of the nearby. Instead, the implanted ions combine with other escaped implanted ions and form gas molecules, which result in gas film in the fissures. It is not only by absorbing the energy of microwave, but also by the inelastic collision with the carriers of the substrate, the kinetic energy of the implanted ions or molecular ions is increased. The carriers produce energy through electromagnetic induction in great profusion and, through the inelastic collision, transfer it into molecular kinetic energy, which increases the colliding rate among the gas molecules, causing enough pressure to separate the thin film from the substrate. According to the current papers published in 1999 about the bonding of silicon nitride and silicon nitride, in making thin film with the corrosion method, the silicon nitride layer has to go through a chemical polishing process and followed by an annealing process at 1100° C. in order to obtain a bonding strength that fulfills the requirement. The first embodiment described previously produces thin films via the electromagnetic induction of the surface polar molecular cluster, and proves the superiority of the present invention.

Microwave is a kind of electromagnetic wave, not producing heat itself, and a silicon substrate is a transparent body for microwave so that it doesn't absorb microwave anymore to produce heat. That means it is the alternating electromagnetic field that, by reacting inductively with the implanted ions or molecular ions, excites the kinetic energy in the molecules to break the bond between these excited molecules and the atoms of the substrate are thus broken. The implanted ions or molecular ions also collide inelastically with the excited electrons or holes in the substrate, absorbing the energy resulted from the electromagnetic induction, increasing their kinetic energy and resulting the free molecule ions condense into gas molecules and expanding the volume of fissures. The heat produced from the electron or hole current can be removed by a cooler designed in the present invention. So it is obvious that the present invention is superior to the prior art in which the heat has to be applied to the substrate to raise the kinetic energy of the implanted ion. The second embodiment of this invention utilizes this method to separate thin-films.

In the embodiments pertaining to the binding of the two substrate with different materials, in order to reduce the thermal effect in the remnant layer, ions are implanted at high temperature so as to create crystal fissures, and then a higher dosage of ions are implanted at low temperature. The supply substrate is bonded with the demanded substrate, and the implanted ions or molecular ions in the supply substrate, under the irradiation of microwave, provide enough energy to separate the thin film from the supply substrate. This method is applied in the third embodiment described above.

In the embodiment with the bonding of two substrates of different materials, an alternative method is used to reduce the thermal effect in the remnant layer. After the ions are implanted in the supply substrate and the ion separation layer is formed, a heating process is applied to the supply substrate, whose implanted ions or molecular ions thus form crystal fissure, and the surface of the supply substrate is thus at a critic separation state. It then is bonded with the demand substrate, and the resulting bonded structure, irradiated by a microwave, absorbs enough energy to separate and transfer the thin film. This method is used in the forth embodiment.

In the embodiment pertaining to the bonding of two substrates of different materials, a different method is applied to reduce the thermal effect in the remnant layer, and to vary the concentration of the carriers by doping different amount of atoms so as to transfer different amount of energy. In this method, a large amount of atoms are doped at a certain depth in the ion separation layer in the supply substrate. As the supply substrate is irradiated by a microwave, the carriers absorb energy and transfer the energy in different amounts depending on the concentration of the carriers. The implanted ions or molecular ions thus absorbed, because of the high concentration of carriers, a great amount of energy in short time, creating crystal fissure; and the carriers in the remnant layer absorb, because of the low concentration of carriers, a lot less amount of energy, slowing the rise of the temperature so as to reduce the thermal effect in thin film transfer. This method is applied to the fifth, sixth and seventh embodiments.

In the embodiments pertaining to the insulation substrate as supply substrate, the ions are implanted at high temperature to create crystal fissures in the ion separation layer without the formation of bubbles. At lower temperature, a second dosage of ions is implanted, saturating the crystal fissures. Then heat, electromagnetic frequency, or high-energy light source is used to excite the ions in the fissures, which combine then combine into gas molecules. The energy is transferred from the excited ions to the gas molecules, and increases the pressure in the ion separation layer so as to separate the thin film. The eighth embodiment uses this method to separate thin-films.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A thin film transferring method comprising:

providing a supply substrate;

performing an ion implantation process to form an ion separation layer in the supply substrate, the ion separation layer defining the following layers in the supply substrate:

a thin film, which is a predetermined portion of the supply substrate into which ions are implanted; and a remnant substrate, which is the remaining portion of the supply substrate without the thin film;

performing a wafer bonding process to bond a demand substrate onto the supply substrate, forming a bonded structure; and using a high frequency alternating electric field, or a high frequency alternating electromagnetic field, to separate the thin film from the remnant substrate, the thin film transferring from the surface of the supply substrate to the surface of the demand substrate.

2. The method of claim 1 wherein the method further comprises a pre-heat process performed after the formation of the ion separation layer, the pre-heat process being used both to polymerize the implanted ions or the molecular ions, and to produce crystal fissures; wherein the resulting stress on the surface of the supply substrate causes bubbles to form within the supply substrate.

3. The method of claim 1 wherein the ion implantation process is a standard ion implantation process, a plasma immersion ion implantation process, or a phase-in ion implantation process that is performed at different temperatures for each process phase.

4. The method of claim 1 wherein the ions used in the ion implantation process comprise hydrogen ions, oxygen ions, nitrogen ions, fluorine ions, chlorine ions, helium ions, or neon ions.

5. The method of claim 1 wherein the ions are used in the ion implantation process are ions or molecular ions.

6. The method of claim 1 wherein the wafer bonding process is a direct bonding process, an anodic bonding process, a low temperature bonding process, a vacuum bonding process, or a plasma enhanced bonding process.

7. The method of claim 1 wherein the wafer bonding process further comprises an ionization process performed on the surface of the supply substrate to provide sufficient bonding strength for the bonding of the supply substrate to the demand substrate.

8. The method of claim 1 wherein the high frequency alternating electric field, or the high frequency alternating electromagnetic field, is generated by a microwave generating device, a radio frequency generating device, an inductive coupled device, a ultraviolet irradiative device, or other irradiative device which increase the kinetic energy of the implanted ions, molecular ions, or reactants produced by reactions between the ions and the substrate in the bonded structure.

9. The method of claim 8 wherein a microwave generating device is used to generate the high frequency alternating electromagnetic field, the frequency of the microwaves being between 2.45 MHz and 900 MHz, the microwave generating device having either a fixed frequency, or a variable frequency.

10. The method of claim 9 wherein the bonded structure is exposed to the microwave radiation for more than 1 minute.

11. The method of claim 8 wherein the kinetic energy of the implanted ions, molecular ions, or reactants produced by reactions between the ions and the substrate in the bonded structure is increased by direct excitation but not by the temperature of the bonded structure.

12. The method of claim 11 wherein a microwave generating device is used to generate the high frequency alternating electromagnetic field, the frequency of the microwaves being between 2.45 MHz and 900 MHz, the microwave generating device having either a fixed frequency, or a variable frequency.

13. The method of claim 12 wherein the bonded structure is exposed to the microwave radiation for more than 1 minute.

14. The method of claim 11 wherein a doping layer in the supply substrate is formed by an ion implantation process, a molecular-beam epitaxy (MBE) growth process, a liquid-phase epitaxy (LPE) growth process, or a vapor-phase epitaxy (VPE) growth process.

15. The method of claim 1 wherein the high frequency alternating electric field, or the high frequency alternating electromagnetic field, is generated by a microwave generating device, a radio frequency generating device, an inductive coupled device, or other devices which generate induced current from carriers in the bonded structure.

16. The method of claim 1 wherein the supply substrate further comprises a doping layer, the doping layer being used to form a various carrier concentration layer, the various carrier concentration layer generating a desired induced energy when exposed to the high frequency alternating electric field, or to the high frequency alternating electromagnetic field.

17. The method of claim 1 wherein when the bonded structure is exposed to the high frequency alternating electric field, or to the high frequency alternating electromagnetic field, a cooling device is used to keep the temperature of the bonded structure below 400° C.

18. A layer transfer method, the method comprising the following steps:
  providing a supply substrate;
  performing an ion implantation process to form an ion separation layer in the supply substrate, the ion separation layer defining the following layers in the supply substrate:
    a thin film, which is a predetermined portion of the supply substrate into which ions are implanted; and
    a remnant substrate, which is the remaining portion of the supply substrate without the thin film;
  performing a wafer bonding process to bond a demand substrate onto the supply substrate, forming a bonded structure; and
  using a high energy light beam exciting device to excite the implanted ions or molecular ions and form a separation film, then separating the thin film and the remnant substrate along the separation film to transfer the thin film from the surface of the supply substrate onto the surface of the demand substrate.

19. The method of claim 18 wherein the ion implantation process is a phase-in ion implantation process, the process being used to implant ions into the supply substrate using at least two different temperatures.

20. The method of claim 18 wherein the supply substrate is made of silicon, and the ion implantation process comprises an ionized hydrogen atom ($H^+$) implantation performed at a temperature between 500° C. and 800° C. with a doping dosage of less than $8\times10^{16}/cm^2$, and the ion implantation process further comprises an ionized hydrogen atom ($H^+$) implantation performed at a temperature that is less than 150° C. with an implant dosage that is greater than $2\times10^{16}/cm^2$, or an ionized hydrogen molecular ($H_2^+$) implantation performed at a temperature that is less than 150° C. with an implant dosage greater than $1\times10^{16}/cm^2$.

21. The method of claim 18 wherein the supply substrate is made of silicon, and the ion implantation process comprises an ionized hydrogen molecular ion ($H_2^+$) implantation performed at 500° C. to 700° C. with an implant dosage that is less than $4\times10^{16}/cm^2$, and the ion implantation process further comprises an ionized hydrogen atom ion ($H^+$) implantation performed at a temperature that is less than 150° C. with an implant dosage that is larger than $2\times10^{16}/cm^2$, or an ionized hydrogen molecular ($H_2^+$) implantation performed at a temperature that is less than 150° C. with an implant dosage larger than $1\times10^{16}/cm^2$.

22. The method of claim 18 wherein the supply substrate is made of sapphire ($Al_2O_3$), and the ion implantation process comprises an ionized hydrogen atom ($H^+$) implantation performed at 550° C. to 800° C. with an implant dosage that is less than $4\times10^{17}/cm^2$, and the ion implantation process further comprises another ionized hydrogen atom ($H^+$) implantation performed at a temperature that is less than 200° C. with an implant dosage that is greater than $6\times10^{16}/cm^2$, or an ionized hydrogen molecular ($H_2^+$) implantation performed at a temperature that is less than 200° C. with an implant dosage larger than $3\times10^{16}/cm^2$.

23. The method of claim 18 wherein the supply substrate is made of sapphire ($Al_2O_3$), and the ion implantation process comprises an ionized hydrogen molecular ($H_2^+$) implantation performed at 550° C. to 800° C. with an implant dosage that is less than $7\times10^{16}/cm^2$, and the ion implantation process further comprises an ionized hydrogen atom (H$^+$) implantation performed at a temperature that is less than 200° C. and an implant dosage that is greater than 6×10$^{16}$/cm$^2$, or an ionized hydrogen molecular (H$_2^+$) implantation performed at a temperature that is less than 200° C. with an implant dosage larger than 3×10$^{16}$/cm$^2$.

24. The method of claim 18 wherein the high energy light beam exciting device generates ultraviolet radiation, x-rays, or laser light.

25. A method for cutting a thin film, the method comprising the following steps:

performing an ion implantation process to form at least one ion separation layer in the thin film and a supply substrate; and exposing the thin film to a high frequency alternating electric field, or to a high frequency alternating electromagnetic field, to form a separating film, and then separating the thin film.

26. The method of claim 25 wherein the thin film is made of Al$_2$O$_3$, SrTiO$_3$, LaAlO$_3$, SiO$_2$, or insulation oxide substrate.

27. The method of claim 25 wherein the thin film is made of Si, Ge, SiGe, semiconductor, or II–VI, or III–V compound semiconductor substrate.

28. The method of claim 25 wherein the ion separation layer is parallel to the horizontal surface of the thin film.

29. The method of claim 25 wherein the ion separation layer is perpendicular to the horizontal surface of the thin film.

30. The method of claim 25 wherein the ion implantation process is a standard ion implantation, plasma immersion ion implantation process, or a phase-in ion implantation process performed at different temperatures at each process phase.

31. The method of claim 25 wherein the ions using in the ion implantation process comprise hydrogen ions, oxygen ions, nitrogen ions, fluorine ions, chlorine ions, helium ions, neon ions, or the molecular ions of these gases.

32. The method of claim 25 wherein the high frequency alternating electric field, or the high frequency alternating electromagnetic field, is a microwave field, a radio frequency field, or an inductive coupled field.

* * * * *